(12) United States Patent
Selinger

(10) Patent No.: US 8,185,685 B2
(45) Date of Patent: May 22, 2012

(54) NAND FLASH MODULE REPLACEMENT FOR DRAM MODULE

(75) Inventor: Robert David Selinger, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 863 days.

(21) Appl. No.: 12/002,188

(22) Filed: Dec. 14, 2007

(65) Prior Publication Data

US 2009/0157950 A1 Jun. 18, 2009

(51) Int. Cl.
*G06F 12/00* (2006.01)
*G06F 13/00* (2006.01)
*G06F 13/28* (2006.01)

(52) U.S. Cl. ........................................ 711/103; 711/206

(58) Field of Classification Search .................... 711/103
See application file for complete search history.

(56) References Cited

U.S. PATENT DOCUMENTS

| | | | |
|---|---|---|---|
| 5,696,917 A * | 12/1997 | Mills et al. | 711/1 |
| 5,829,013 A * | 10/1998 | Hasbun | 711/103 |
| 5,933,847 A * | 8/1999 | Ogawa | 711/103 |
| 6,047,361 A * | 4/2000 | Ingenio et al. | 711/167 |
| 7,234,049 B2 | 6/2007 | Choi et al. | |
| 2004/0117686 A1 * | 6/2004 | Vainsencher et al. | 714/13 |
| 2004/0123033 A1 * | 6/2004 | Rudelic | 711/118 |
| 2005/0086423 A1 | 4/2005 | Zitlaw | |
| 2005/0235131 A1 * | 10/2005 | Ware | 711/203 |
| 2006/0080501 A1 | 4/2006 | Auerbach et al. | |
| 2006/0277388 A1 * | 12/2006 | Paley et al. | 711/173 |
| 2008/0046630 A1 | 2/2008 | Lasser | |
| 2008/0046638 A1 | 2/2008 | Maheshwari et al. | |
| 2008/0046639 A1 | 2/2008 | Tsuji | |
| 2008/0046641 A1 | 2/2008 | Lasser | |
| 2008/0177923 A1 * | 7/2008 | Klein | 710/306 |

OTHER PUBLICATIONS

Open NAND Flash Interface (ONFi) press release, Jan. 22, 2007; http://www.onfi.org/01222007press.html.

* cited by examiner

*Primary Examiner* — Brian Peugh
*Assistant Examiner* — Prasith Thammavong
(74) *Attorney, Agent, or Firm* — G. Marlin Knight

(57) ABSTRACT

An electronic memory module according to the invention provides non-volatile memory that can be used in place of a DRAM module without battery backup. An embodiment of the invention includes an embedded microprocessor with microcode that translates the FB-DIMM address and control signals from the system into appropriate address and control signals for NAND flash memory. Wear-leveling, bad block management, garbage collection are preferably implemented by microcode executed by the microprocessor. The microprocessor, additional logic, and embedded memory provides the functions of a flash memory controller. The microprocessor memory preferably contains address mapping tables, free page queue, and garbage collection information.

17 Claims, 2 Drawing Sheets

NAND FLASH MODULE REPLACEMENT FOR DRAM MODULE

FIELD OF THE INVENTION

The invention relates to the field of memory module design and more particularly to the design of memory modules using non-volatile flash memory.

BACKGROUND

Many memory systems including Storage Subsystem Controllers commonly use DRAM chips mounted on small cards known as DIMMs as common memory modules. The DIMM modules can include several DRAM units, as well as buffers, clocking and a memory controller. The DIMMs are interfaced to the host CPU and Memory controllers via a variety of standard interface buses such as DDR, DDR2, DDR3 and FB-DIMM, which specify the addressing, data, clock, power and ground connections. DRAMs are volatile, so when used in systems such as storage subsystems that require non-volatility, additional batteries and battery monitoring and recharging circuitry must be added to DRAMs to make them non-volatile.

Flash memory is a specific type of EEPROM that is erased and programmed in relatively large blocks. NAND flash memory is becoming cheaper than DRAM on a cost per bit basis and is inherently nonvolatile so battery backup is not required. However, NAND flash operation differs from DRAM, for example, in that erase-operations, which are required before new data can be written, can only be performed on entire blocks of data. In this way NAND flash is similar to a disk drive. NAND flash is also typically slower than DRAM, and NAND flash has different and frequently proprietary chip level interfaces. Typical commercially available NAND flash memory chips require multiplexed input/output (I/O) pins for handling data and commands. A NAND flash memory device is typically accessed with bursts of data, for example, 512 bytes of data might be written to or read from the device in one burst. Thus, NAND flash cannot directly replace DRAM or any other devices that allow byte or word level random access.

Another limitation is that flash memory is subject to faster wear-out than DRAM, because it has a limited number of times that it can be erased and rewritten. This limitation can be offset in part by wear-leveling techniques which involve remapping blocks of the flash in order to prevent the erase-write operations from being concentrated in certain blocks.

FB-DIMM is a daisy chain architecture using a high speed serial interface with fully buffered dual inline memory modules. The architecture includes separate unidirectional read and write channels. All memory control for the DRAM devices resides in the host, including memory request initiation, timing, refresh, scrubbing, sparing, configuration access, and power management. Commercially available Advanced Memory Buffer (AMB) integrated circuits, for example those made by Intel Corporation, are compliant with the FB-DIMM Architecture and Protocol Specification. The AMB interface is responsible for handling the FB-DIMM channel and memory requests to and from the local DIMM and for forwarding requests to other DIMMs on the FB-DIMM channel. Fully Buffered DIMMs use commodity DRAMs isolated from the channel behind a buffer on the DIMM.

There is a need for nonvolatile memory card designs that are sufficiently similar to those using DRAM so that non-volatile memory can be added to existing systems with minimal changes in the system design.

SUMMARY OF THE INVENTION

An electronic memory module according to the invention provides non-volatile memory that can be used in place of a DRAM module without battery backup. One embodiment of the invention is an electronic memory module (device) with a NAND flash memory that can be used in place of a DRAM memory module in certain applications without requiring wear-leveling methods to be implemented elsewhere in the system. Alternatively a memory module according to the invention uses NAND flash but is largely compatible with the FB-DIMM standards and generally performs like a DRAM based FB-DIMM although at a slower speed. This embodiment of the invention can thereby provide non-volatile memory that can be incorporated into existing system designs that use FB-DIMMs with minimal design changes.

An embodiment of the invention includes embedded microprocessor with microcode that translates the FB-DIMM address and control signals from the system into appropriate address and control signals for the NAND flash. Wear-leveling, bad block management, garbage collection are preferably implemented by microcode executed by the microprocessor. The microprocessor, additional logic, and embedded memory provide the functions of a flash memory controller. The microprocessor memory preferably contains address translation (mapping) tables, bad block mapping table, free page queue and garbage collection information. Preferably error correction circuitry (ECC) is also included in the module to encode redundant information along with the data that is written to the NAND flash memory.

Read requests for DRAM addresses are mapped to the correct area in flash using the address translation tables which includes the page and offset in the flash memory. The data is read from the flash, and sent in serial form over the data out bus. Write requests are implemented by an update sequence in which the current page(s) containing the data to be updated are read into RAM, the new data is inserted into the page(s) at the predetermined offset point, the old page(s) is marked for subsequent garbage collection, and the new data block is programmed (written) to a new page in the flash. The wear-leveling algorithm results in the new data page being written to a different location. Write requests are mapped to "clean" pages in the flash that have been erased as part of the garbage collection routine. In one embodiment a queue of free pages is maintained in order of last use so that the least recently used page is selected when a new page is needed. Background garbage collection is preferably performed by microcode routines. When sufficient pages in a block are marked as dirty, pages still in use are moved to other blocks, the whole block gets erased and all of the pages are placed in the queue for reuse.

The address translation tables are preferably kept in RAM but must be recoverable from non-volatile memory after power has been removed or lost. Alternative embodiments include saving the tables in non-volatile memory when imminent loss of power is detected. In another embodiment the tables are rebuilt after a power loss from metadata saved in non-volatile memory whenever pages are written in the flash memory.

A memory module according to the invention will typically perform faster than data can be read from the disk in a disk drive, but slower than DRAM. The module according to the invention is most efficient when used in applications that do not require small block transfers or vast amounts of writing.

DETAILED DESCRIPTION OF THE INVENTION

A preferred embodiment of the invention is a NAND flash based memory module that is plug compatible with existing DRAM and DIMM modules to enable NAND flash to be included in systems where DRAMs and DIMMs were previously used. Because NAND flash is slower, application workload may preclude its use in some systems. However, in large storage controllers for disk drives, the DRAM memory arrays are accessed in large blocks, frequently doing 16K-64K transfers at a time which makes the use of flash memory feasible. Likewise, most printer controllers do not require high data rates, so a flash memory module according to the invention could be used effectively.

Buffering architecture allows the output to be delayed while the appropriate block of data is read from the flash at less than DRAM speed. In general, where asynchronous interfaces are used from the host to the memory target, the system according to the invention can supply data from the slower NAND flash without causing system problems. Preferably the system has internal RAM so that it can prefetch entire pages from NAND flash for reads, and likewise, do read-modify-write operations for host driven write commands (preferably keeping the updated page so that each small write does not become a separate NAND page write).

Figure 1:
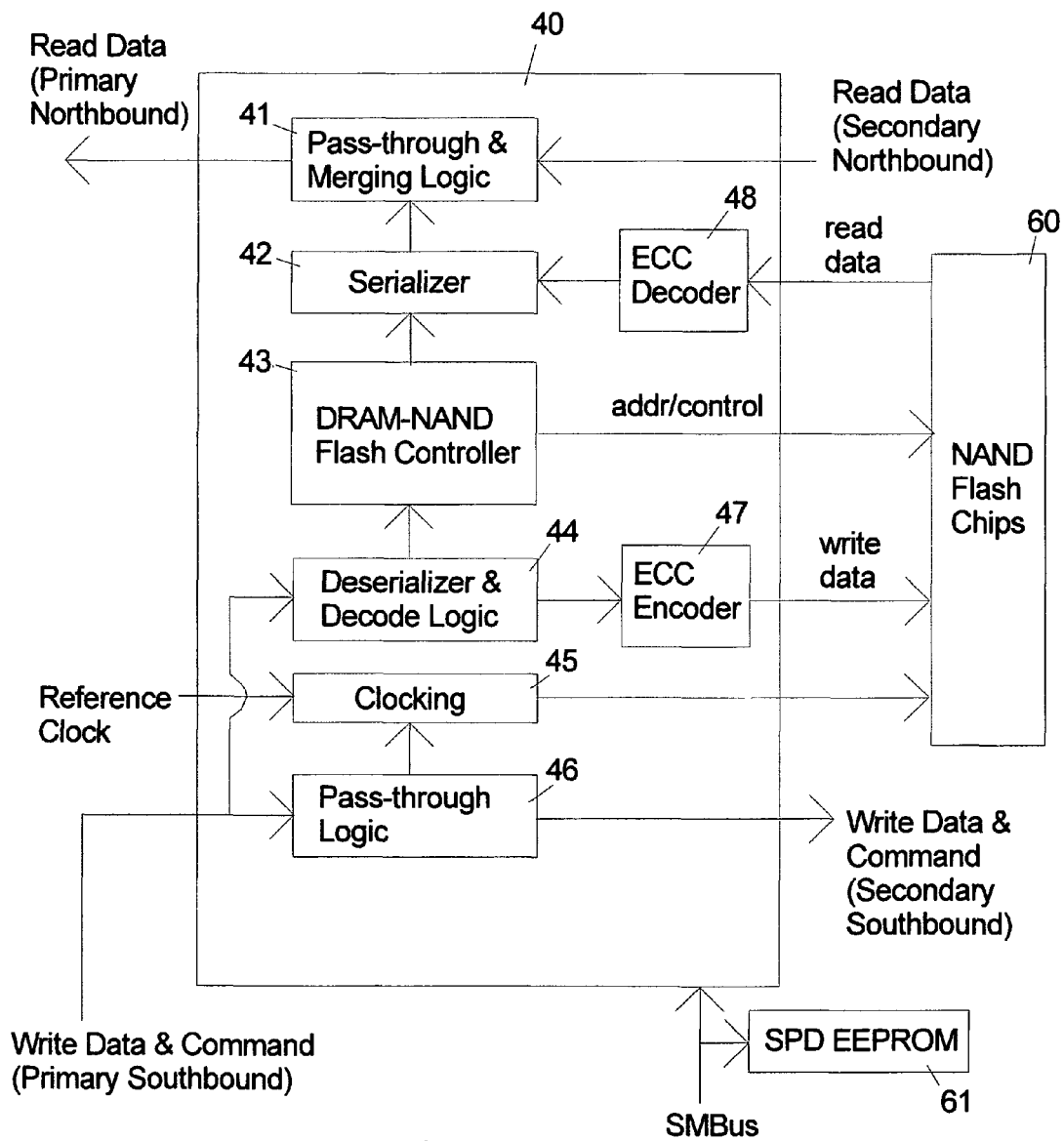
FIG. 1 is a block diagram illustrating an embodiment of the invention in an FB-DIMM module similar to Advanced Memory Buffer (AMB) format.

FIG. 1 is a block diagram illustrating an embodiment of the invention in an FB-DIMM controller module 40 with external behavior similar to Advanced Memory Buffer (AMB) devices except as described below. The invention uses DRAM-NAND flash controller 43 to translate requests for DRAM read/write operations into NAND flash operations to allow the NAND flash array 60 to be used according to the invention with FB-DIMM module 40. The DRAM-NAND flash controller 43 supplies the control and address signals needed by the NAND flash array 60. These signals are different than those used by DRAM devices and may vary with different designs. For example, NAND Flash devices typically do not contain dedicated address pins. Data, commands and addresses are multiplexed onto the same pins and received by I/O control circuits and must be latched into registers. Addresses might be loaded using a 5-cycle sequence, for example. A NAND flash memory array 60 is typically programmed (written) in page-based operations and is erased in blocks comprising multiple pages. For example, a page is typically 2 or 4 KB which is only ⅟32nd of a block.

Elements from prior art AMB devices included are pass-through and merging logic 41; pass-through logic 46; serializer 42; deserializer and decode logic 44; and Serial Presence Detect (SPD) EEPROM 61. The device interfaces to the DIMM bus and provides data transfers in the same way that an FB-DIMM module with DRAM memory does. The DRAM-NAND flash controller 43 will be described in more detail below.

While DRAM modules may incorporate ECC, some types of flash (especially MLC) require a higher rate of ECC coverage than DRAMs and without wear-leveling and garbage collection, repeated reads or writes to one location would eventually cause loss of data. The memory module according to the invention could also include extra (invisible to the system) capacity to provide for some blocks to go bad during the life of the device. The invention uses ECC encoder 47 to encode the data written to NAND flash 60 using prior art techniques which typically involve adding special redundant ECC information along with the original data as it is written out. The input for the ECC encoder 47 is supplied by deserializer and decode logic 44.

When the data is read back from the NAND flash 60, reciprocal ECC decoder 48 recalculates redundant ECC information using the data as read and compares the calculated ECC information with what was read from the memory. If a mismatch occurs the redundant ECC information read from memory is used to correct errors up to the capability of the ECC encoding. Errors that cannot be corrected by ECC are permanent and must be handled accordingly. The output from the ECC decoder 48 is fed to the serializer 42.

Figure 2:
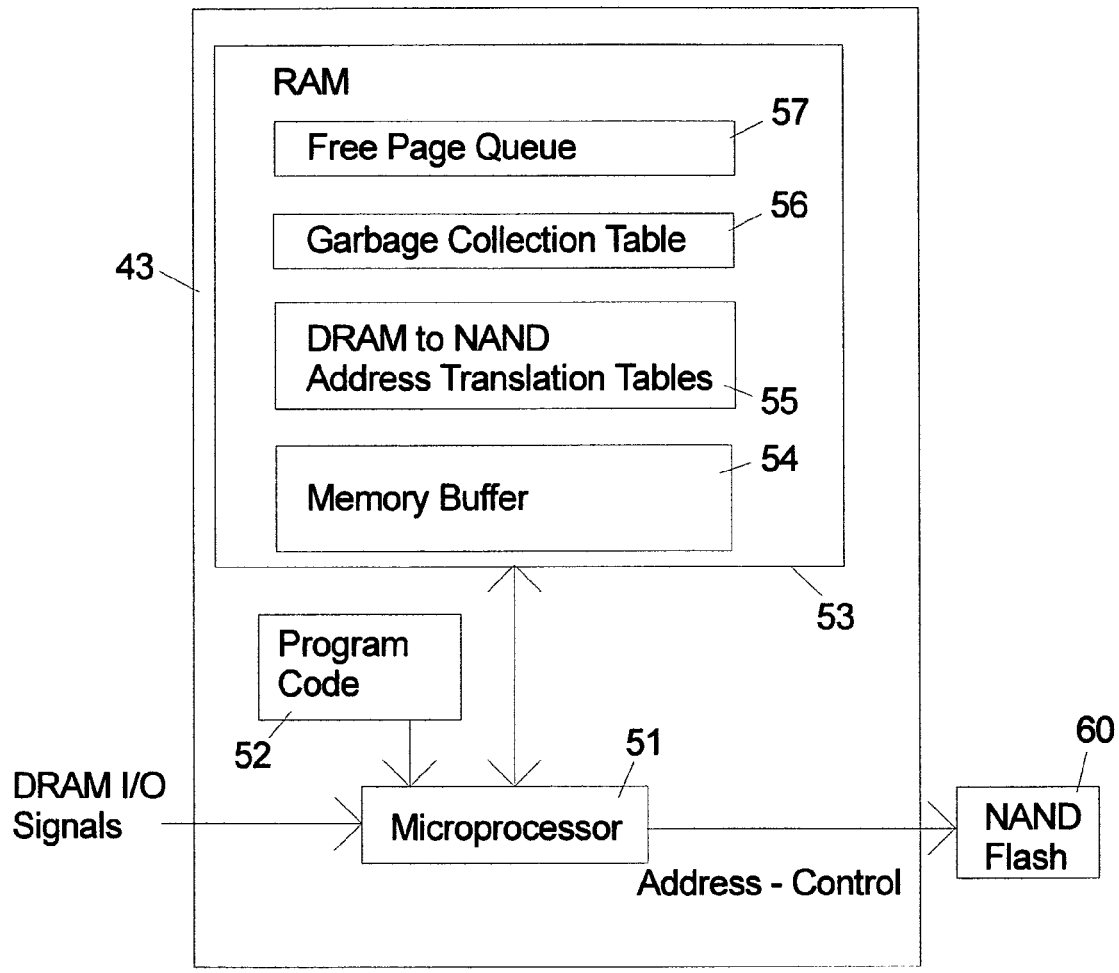
FIG. 2 is a block diagram illustrating an embodiment of a controller for use with NAND flash according to an embodiment of the invention.

FIG. 2 is a block diagram illustrating an embodiment of a DRAM-NAND flash controller 43 for use with NAND flash chip array 60 according to an embodiment of the invention. The controller 43 can be implemented as a "system on a chip" with an embedded microprocessor 51, program code 52 and embedded RAM memory 53. The system responds to DRAM commands using NAND flash as the memory. Program code 52 must originate in non-volatile memory, but the instructions can be copied into RAM for execution. Embedded RAM memory 53 includes address translation tables 55 that are used to translate addresses in DRAM read/write requests into NAND flash addresses. The DRAM addresses are treated as logical addresses that are mapped into physical NAND flash addresses.

Addresses in read requests are mapped to the correct block in NAND flash using the address translation tables 55. The address for the NAND flash will typically include at least a page and offset portion to reference a particular starting point in the flash memory. In general the length of data to be read from NAND flash can be any number of bytes or words, including a single byte, up to the maximum size allowed in the particular design. The appropriate data from the flash is read, and the result is serialized over the data out bus as described above.

By providing dynamic logical to physical address translation, the use of the address translation tables 55 allows the system to achieve the important functions of bad block mapping and wear-leveling. When bad blocks are detected they will be permanently eliminated from being accessed preferably by removing them from the address translation tables. NAND flash chips may have bad blocks when they are shipped from the factory; therefore, special provision should preferably be made for initially mapping the bad blocks as part of the system setup. This mapping is not typically required for DRAM devices, so the FB-DIMM module 40 and in turn the controller 43 should be designed to have a special pin(s), jumpers, switches, commands, or initial power-up functions on that can be used to trigger the initial bad block mapping. The manufacturers of NAND flash typically mark the bad blocks in some arbitrary way such as writing particular data in designated locations to indicate that a block is bad. Once a device is being used for random data the arbitrary initial marking may no longer be valid; thus the initial processing of factory-marked bad blocks may only be done prior to actual use of the NAND flash for data.

Wear-leveling requires that the address mapping be changed frequently as the NAND flash is used. Any prior art wear-leveling algorithm can be used. In this embodiment the device preferably maintains a garbage collection table 56 that records each page of NAND flash memory that has been previously programmed with data, but is no longer being used. As pages of memory are updated, the pages are marked in the garbage collection table 56, but actual garbage collection typically only takes place when triggered by conditions that can be determined by the prior art. This process is dictated by the fact that NAND flash memory is designed to be erased at the block level. The simplest case occurs when every page in a block is marked as dirty which allows the entire block to be erased. However, it is typically desirable to consolidate or defragment partially used blocks when selected conditions arise. For example, if only one page out of 32 pages in a block is being used and the other 31 are dirty pages, the one page in use can be copied to another block, the old block erased and returned to a free list, and the address mapping tables updated accordingly.

After a block is erased in the garbage collection process, it is again available for each page to be re-written with new data. The new data is typically programmed into the memory one page at a time. In the embodiment shown in FIG. 2 the system maintains free page queue 57 which preferably records the order in which the pages were last used. This allows the microprocessor to select the least recently used page each time a new page is written to implement wear-leveling. By moving each page of memory to the least recently used page that is available when updating data in a page, wear-leveling is accomplished. The mapping in the address translation tables 55 is changed to point to the new physical flash page. Whatever wear-leveling is performed is transparent to the host system which does not know of or care what physical locations in the NAND flash are actually used for any particular unit of data.

The DRAM to NAND address translation tables 55 are preferably kept in RAM as a performance enhancement so that the microprocessor does not have to scan the NAND Flash array to determine the current mapping when each access command is processed. In order to preserve the mapping information across power-down cycles, in one alternative the complete table could be written to NAND flash memory when an impending power loss is sensed. Any prior art method of detecting power loss can be used. For example, one method is to provide power failure detection logic and a capacitor connected to the power input of the device to briefly provide power for the shutdown procedures. In another alternative the mapping data is recorded with each page of flash memory whenever a write occurs. In this scenario the corresponding (logical) host DRAM address for each NAND page of data is written in the extra bytes (metadata) associated with each page when the page is written. When the device is powered-up after power is lost or removed, in addition to reading the bad block information, the initialization procedures in the microcode can include rebuilding the translation table in RAM by reading the mapping metadata for each page in the NAND flash memory.

DRAM-type write requests are implemented by an update sequence in which the current page(s) contents are read into a RAM memory buffer 54, the new data is inserted into the page(s) in RAM at the appropriate offset point, the old page(s) is marked in garbage collection table 56 for subsequent processing, and the new data page(s) is programmed (written) in the flash memory at a new page(s) selected from the free page queue 57. The address translation table 55 will initially provide the page address and offset for the old data.

As noted the wear-leveling algorithm will result in the new data page being written to a different location in the NAND flash which requires updating the mapping tables. Write requests must be mapped to "clean" pages in the flash, and background garbage collection is performed by microcode routines. The old page is marked dirty and is eventually erased and marked for reuse by the garbage collection process by adding the pages to the free page queue 57.

The invention has been described with reference to specific embodiments, but one of ordinary skill in the art will readily recognize variations to the embodiments and those variations are within the spirit and scope of the present invention.

The invention claimed is:

1. A method of operating an electronic memory module comprising:
   accepting a write command formatted for DRAM from a host device, the write command including a DRAM address;
   using a translation table to convert the DRAM address into a non-volatile EEPROM memory write address in an old page in a non-volatile EEPROM memory;
   reading previous data in the old page from the non-volatile EEPROM memory;
   updating the previous data with new data supplied in the write command to form an updated new page of data;
   writing a new page in the non-volatile EEPROM memory with the updated page of data and metadata that includes the DRAM address; and
   updating the translation table to map the DRAM address to the new page in the non-volatile EEPROM memory.

2. The method of claim 1 wherein the non-volatile EEPROM memory is NAND flash memory.

3. The method of claim 1 further comprising updating a table to mark the old page for garbage collection; and performing garbage collection when pages in a block have been marked for garbage collection by moving any pages in use to other blocks, erasing the block and marking the pages in the block as available for writing.

4. The method of claim 1 wherein writing the new page further comprises selecting a least recently used page in the non-volatile EEPROM memory as the new page.

5. The method of claim 1 further comprising:
   accepting a read command formatted for DRAM from the host device, the read command including a logical DRAM read address;
   using the translation table to convert the DRAM read address into a physical read address in a non-volatile EEPROM memory;
   reading data from the physical read address in a non-volatile EEPROM memory; and
   delivering the data from the physical read address to the host device.

6. The method of claim 1 further comprising responding to a detection of imminent loss of power by saving the translation table in non-volatile memory.

7. The method of claim 1 further comprising building the translation table after a loss of power by reading the DRAM addresses for each page in the metadata saved in non-volatile memory.

8. A method of operating an electronic memory module comprising:
   accepting a write command formatted for DRAM from a host device, the write command including a DRAM address;
   using a translation table to convert the DRAM address into a non-volatile EEPROM memory address in an old page in a NAND flash memory;
   reading previous data in the old page from the non-volatile EEPROM memory;

updating the previous data with new data supplied in the write command to form an updated page of data;
selecting an unused writable page in the non-volatile EEPROM memory as a new page;
writing the new page in the non-volatile EEPROM memory with the updated page of data and metadata that includes the DRAM address;
updating the translation table to map the DRAM address to the new page; and
marking the old page as requiring garbage collection.

9. The method of claim 8 further comprising performing garbage collection when pages in a first block have been marked for garbage collection by copying any pages in use to a second block, erasing the first block and marking the pages in the first block as available for writing.

10. The method of claim 8 further comprising responding to a detection of imminent loss of power by saving the translation table in non-volatile memory.

11. An electronic memory module comprising:
NAND flash memory;
an address table that maps DRAM addresses to NAND flash memory addresses; and
a controller that accepts a write command formatted for DRAM memory module including a DRAM address and converts the write command into a sequence of operations including: a read operation for an old page in NAND flash memory mapped to the DRAM address in the address table and a write operation for a new page in NAND flash memory that includes metadata that includes the DRAM address and an update of the address table to map the DRAM write address to the new page.

12. The electronic memory module of claim 11 further comprising means for marking the old page as requiring garbage collection after the write operation.

13. The electronic memory module of claim 11 further comprising means for garbage collection after pages in a block have been marked for garbage collection.

14. The electronic memory module of claim 11 wherein the means for garbage collection further comprises means for erasing the block and marking the pages in the block as available for writing.

15. The electronic memory module of claim 11 further comprising error correction circuitry (ECC) for adding redundant information to data written to NAND flash memory.

16. The electronic memory module of claim 11 further comprising means for responding to a detection of imminent loss of power by saving the translation table in non-volatile memory.

17. The electronic memory module of claim 11 further comprising microcode for building the translation table after a loss of power by reading the metadata including the DRAM addresses for each page saved in non-volatile memory.

* * * * *